(12) United States Patent
Kondo et al.

(10) Patent No.: US 6,706,335 B2
(45) Date of Patent: Mar. 16, 2004

(54) METHOD OF FORMING SILICON-BASED THIN FILM

(75) Inventors: Takaharu Kondo, Kyoto (JP); Koichi Matsuda, Kyoto (JP); Makoto Higashikawa, Nara-ken (JP)

(73) Assignee: Canon Kabushiki Kaisha, Tokyo (JP)

( * ) Notice: Subject to any disclaimer, the term of this patent is extended or adjusted under 35 U.S.C. 154(b) by 269 days.

(21) Appl. No.: 09/865,549

(22) Filed: May 29, 2001

(65) Prior Publication Data

US 2002/0034645 A1 Mar. 21, 2002

(30) Foreign Application Priority Data

May 31, 2000 (JP) ......................... 2000/162805

(51) Int. Cl.$^7$ ................................. H05H 1/02
(52) U.S. Cl. ........................ 427/574; 427/578
(58) Field of Search ................... 427/574, 578

(56) References Cited

U.S. PATENT DOCUMENTS

| | | |
|---|---|---|
| 4,933,203 A | 6/1990 | Curtins |
| 4,987,008 A * | 1/1991 | Yamazaki et al. ......... 427/53.1 |
| 5,387,542 A | 2/1995 | Yamamoto et al. |
| 5,476,694 A * | 12/1995 | Ishihara et al. ............. 427/585 |
| 5,645,947 A * | 7/1997 | Hirooka et al. ............. 428/688 |
| 5,676,765 A | 10/1997 | Saito et al. |
| 5,910,342 A * | 6/1999 | Hirooka et al. ............. 427/573 |
| 6,100,466 A * | 8/2000 | Nishimoto ................... 136/258 |

FOREIGN PATENT DOCUMENTS

| | | |
|---|---|---|
| EP | 1032054 A2 | 8/2000 |
| EP | 1041646 A1 | 10/2000 |
| JP | 5136062 | 6/1993 |

* cited by examiner

Primary Examiner—Bret Chen
(74) Attorney, Agent, or Firm—Fitzpatrick, Cella, Harper & Scinto

(57) ABSTRACT

In a high frequency plasma CVD using a source gas comprising a silicon halide and hydrogen, the value of Q defined by $Q = P_o \times P_R / S / d$ is controlled so as to be 50 or more, wherein $P_o$ (W) is a supplied power, S (cm$^2$) is the area of a high frequency introducing electrode, d (cm) is a distance between the high frequency introducing electrode and a substrate, and $P_R$ (mTorr) is a pressure. Thereby, a method of forming a silicon thin film, a silicon thin film and a photovoltaic element excellent in photoelectric characteristics are provided which attain a film forming rate of an industrially practical level.

4 Claims, 5 Drawing Sheets

METHOD OF FORMING SILICON-BASED THIN FILM

BACKGROUND OF THE INVENTION

1. Field of the Invention

The present invention relates to a method of forming a silicon-based thin film, a silicon-based thin film and a photovoltaic element such as solar cell or sensor formed by depositing one set or more of pin junctions.

2. Related Background Art

As a method of forming a silicon thin film showing crystallinity, there have so far been carried out a method such as the cast method based on the growth from a liquid phase, which, however, needs high temperature processing and has a problem to mass production and cost reduction.

As a method of forming a silicon thin film showing crystallinity other than the cast method, there has been known a method of performing a hydrogen plasma processing after the formation of amorphous silicon and repeating this to form a polycrystalline silicon film, disclosed in Japanese Patent Application Laid-Open No. 5-136062.

With a photovoltaic element using a silicon thin film showing crystallinity, it is generally known that the effect of dangling bonds or the like in crystal grain boundaries of silicon, distortions in the vicinity of crystal grain boundaries, imperfectness of crystals themselves and so on hinder the transportability of carriers, thereby badly affecting the photoelectric characteristics as a photovoltaic element.

As countermeasures to reduce the above effects, such contrivances have been required as lowering the film forming rate to improve the crystallizing ratio and the crystallinity or effecting the film formation while repeating the formation of a silicon film and the annealing in a hydrogen atmosphere. These processing has provided a factor for prolonging the film forming time to increase the cost.

SUMMARY OF THE INVENTION

Thus, it is an object of the present invention to solve the above mentioned problems and to provide a method of forming a silicon thin film, a silicon thin film and a photovoltaic element that attain excellent photoelectric characteristics and a film forming rate of an industrially practical level.

According to a first aspect of the present invention, there is provided a method of forming a silicon-based thin film comprising effecting high frequency plasma CVD using a source gas comprising a silicon halide and hydrogen, wherein the value of Q defined by $Q = P_o \times P_R / S / d$ is 50 or more, wherein $P_o$ (W) is a supplied power, S (cm$^2$) is the area of a high frequency introducing electrode, d (cm) is a distance between the high frequency introducing electrode and a substrate, and $P_R$ (mTorr) is a pressure.

According to a second aspect of the present invention, there is provided a silicon-based thin film formed by high frequency plasma CVD using a source gas comprising a silicon halide and hydrogen, wherein the high frequency plasma CVD is effected under such conditions that the value of Q defined by $Q = P_o \times P_R / S / d$ is 50 or more, wherein $P_o$ (W) is a supplied power, S (cm$^2$) is the area of a high frequency introducing electrode, d (cm) is a distance between the high frequency introducing electrode and a substrate, and $P_R$ (mTorr) is a pressure.

According to a third aspect of the present invention, there is provided a photovoltaic element comprising a semiconductor layer comprised of at least one pin junction on a substrate, at least one i-type semiconductor layer being formed by high frequency plasma CVD using a source gas comprising a silicon halide and hydrogen, wherein the element comprises a silicon-based thin film comprising a crystal phase formed under such conditions that the value of Q defined by $Q = P_o \times P_R / S / d$ is 50 or more, wherein $P_o$ (W) is a supplied power, S (cm$^2$) is the area of a high frequency introducing electrode, d (cm) is a distance between the high frequency introducing electrode and a substrate, and $P_R$ (mTorr) is a pressure.

It is preferable that the above silicon halide contains at least one element of fluorine and chlorine.

It is preferable that the flow rate of the hydrogen in the above source gas is equal to or greater than the flow rate of the silicon halide.

The above pressure $P_R$ is preferably 50 mTorr or more. More preferably it is 100 mTorr or more and most preferably 500 mTorr or more. Its upper limit is preferably 20 Torr.

With the above silicon thin film, the Raman scattering intensity originating in a crystal component is preferably three or more times the Raman scattering intensity originating in an amorphous component.

With the above silicon thin film, the diffraction intensity for (220) by X-ray or electron beam diffraction is preferably 50% or more of the total diffraction intensity. Below 50%, the lowering in crystal grain boundary density becomes remarkable. More preferably it is 60% or more and most preferably 70% or more. Its upper limit is preferably 95%.

DESCRIPTION OF THE PREFERRED EMBODIMENTS

Figure 1:
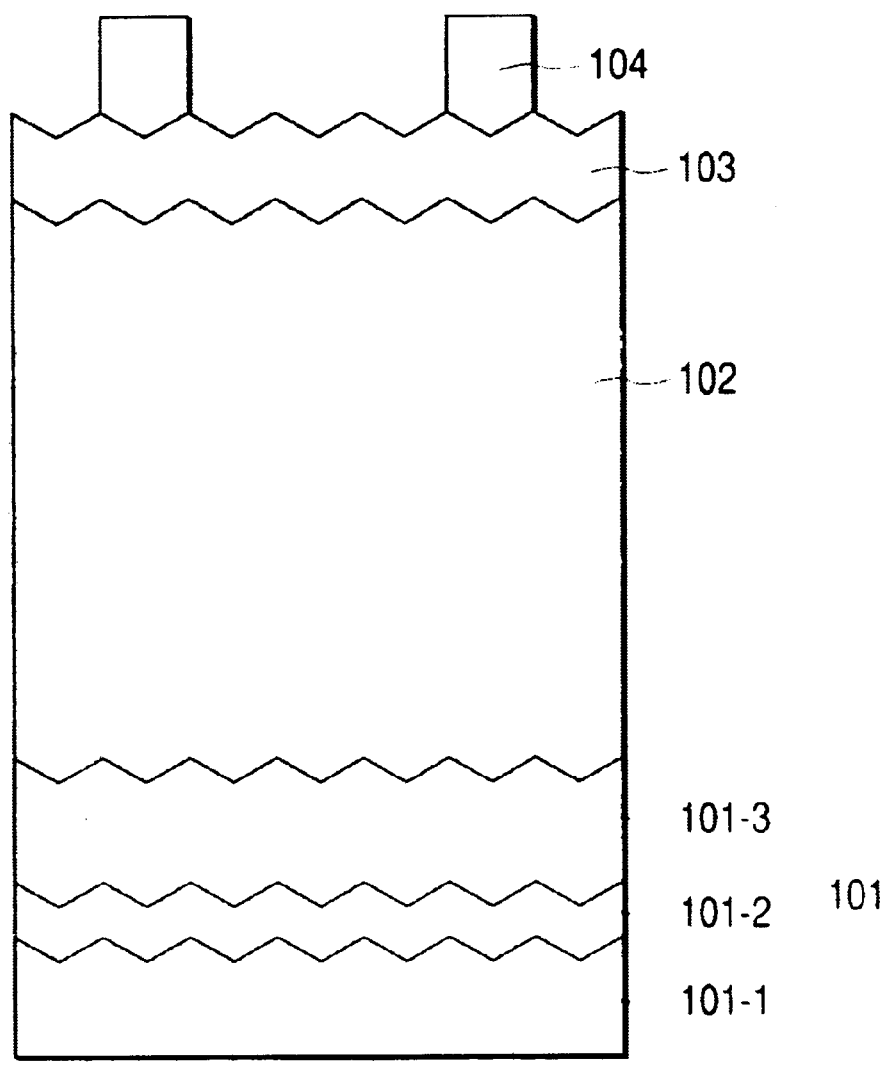
FIG. 1 is a schematic sectional view showing an example of the photovoltaic element according to the present invention.

As a result of extensive studies to solve the above problems, the present inventors have found that a source gas containing a silicon halide and hydrogen can be used in a high frequency plasma CVD to deposit a silicon-based thin film high in crystallizing ratio and good in crystallinity at a high speed under conditions such that the value of Q defined by $Q = P_o \times P_R / S / d$ is 50 or more, wherein $P_o$ (W) is a supplied power, S (cm$^2$) is a high frequency introducing electrode area, d (cm) is a distance between a high frequency introducing electrode and a substrate and $P_R$ (mTorr) is a pressure, and that use of the above silicon-based thin film for at least a part of at least one i-type semiconductor layer of a photovoltaic element comprising at least one pin junction on a substrate enables a photovoltaic element with a good photoelectric conversion efficiency, excellent in adhesion and environmental resistivity, to be formed at a greatly reduced cost in comparison with the prior art methods.

The above constitution provides the following actions.

Because of being able to shorten the process time and also lower the process temperature in comparison with the solid phase reaction, the method of forming a silicon-based thin film containing a crystal phase by the plasma CVD using a high frequency is advantageous to the cost reduction. Especially in a photovoltaic element comprising pin junction(s), its application to an i-type semiconductor layer with a large film-thickness greatly manifests this effect.

In the case of employing an i-type semiconductor layer substantially functioning as a light-absorbing layer as the i-type semiconductor layer containing a crystal phase, there is a merit that the photodegradation phenomenon due to the Staebler-Wronski effect that becomes an issue for the amorphous material can be suppressed. Here, with the high frequency plasma CVD process using a source gas containing a silicon halide and hydrogen, various active species are formed in the plasma. When X represents a halogen atom, $SiX_nH_m$ ($0 \leq n$, $m \leq 4$), HX, X, H and the like can be included as the types of active species in the plasma. The details of functions of these active species are unclear, but it is believed that such plasma is characterized by also containing active species contributing to etching in addition to active species contributing to the deposition of a silicon-based thin film. Accordingly, the progress of film deposition accompanied with etching of Si-Si bonds of relatively weak bonding strength in the film surface is thought to enable the formation of a silicon-based thin film that has less amorphous area and a large crystallizing ratio.

Besides, during the etching, radicals are formed by the breakage of bonds and the structure relaxation is enhanced, the formation of a good quality silicon-based thin film is thought to become possible at a lower process temperature.

Here, as the problem in the case of adopting a silicon-based thin film containing a crystal phase for the i-type semiconductor layer, the crystal grain boundaries are known to affect both majority carriers and minority carriers to degrade the performance. To suppress the effect of the crystal grain boundaries, enlarging the crystal grain size of the i-type semiconductor layer to reduce the crystal grain boundary density is thought to be one of the effective means. In cases where the deposition of a film proceeds at random crystal orientations, individual crystal grains are thought to collide with each other during the growth, thereby reducing the sizes of the crystal grains relatively, but orienting crystal growth in a given direction to making the directionality of growth uniform enables the random mutual collision of crystal grains to be suppressed, with the result that the crystalline grain size is expected to increase. Besides, in crystalline silicone taking the diamond structure, since the (220) plane is the highest in the in-plane atomic density, setting this plane to the growth plane enables a silicon-based thin film with good adhesion to be formed and therefore is preferred. It is seen from the ASTM card that the percentage of the diffraction intensity in the (220) plane relative to the total of diffraction intensities of 11 reflection portions from the low angle side is about 23% and it follows that a structure with the percentage of the diffraction intensity in the (220) plane exceeding 23% has an orientation property (or orientatability) in the direction of this plane. Especially, in a structure with the percentage of the diffraction intensity in the (220) plane equal to or greater than 50%, the above effect is enhanced more and particularly preferred. As a result of extensive studies in consideration of the suppression of photodegradation phenomenon due to the Staebler-Wronski effect and the decrease in the crystal grain boundary density, the present inventors have found it preferable that the Raman scattering intensity resulting from the crystal component (typically, near 520 cm$^{-1}$) is at least three times the Raman scattering intensity resulting from the amorphous component (typically, near 480 cm$^{-1}$).

To implement the formation of a silicon-based thin film having such orientatability and crystallizing ratio as mentioned above during the deposition and etching at a high speed as the total, the control of the plasma process becomes an important technical task. In order to perform the high speed film formation, the increase in the input power is required for raising the decomposition efficiency of a source gas, but at this time, not only neutral active species playing the role of deposition and etching but ions also are accelerated simultaneously. The ions are accelerated by the electrostatic attraction in the sheath region near the substrate to serve as a main cause for distorting crystal lattices or generating voids in the film by the ion collision with the deposited film and accordingly are thought to make a hindrance against the formation of a high-quality silicon-based thin film and lower the adhesion with the underlying layer or the environmental resistance. Here, if the plasma is generated under conditions of the pressure $P_R$ being high, ions in the plasma can be expected to increase the chance of collision with other ions, active species or the like so that the ion impact lowers or the ion density itself decreases.

Besides, in the state that the pressure $P_R$ is high and the distance between the substrate and the vicinity of an electrode as the high frequency introducing electrode is small, it is believed that a high density plasma can be generated in the vicinity of the substrate, thereby promoting the deposited film surface reaction such as depositing action and etching action also.

Forming a high-quality silicon-based thin film at a high speed as mentioned above is thought to be made possible by adjusting the forming conditions such as the pressure of a plasma and the electric power and controlling the plasma density or the types of active species.

As a result of extensive studies, the present inventors have found that the conditions that the value of Q defined by $Q=P_o \times P_R/S/d$ is 50 or more, wherein $P_o$ (W) is the supplied power, S (cm$^2$) is the area of the high frequency introducing electrode, d (cm) is the distance between the high frequency introducing electrode and the substrate, and $P_R$ (mTorr) is the pressure, are preferable in high speed formation of a high-quality silicon-based thin film with a high orientatability and a high crystallizing ratio. Especially, on considering the effect of reduction in ion damages or the like, the pressure is preferably 50 mTorr or more.

Besides, in case of high speed film formation at a high pressure in the SiH$_4$ system, a decrease in crystallinity due to the generation of higher order silanes as reaction by-products is observed and powder such as polysilanes generated is deposited in the apparatus, the exhaust system and the like, which is the main cause for lowering the operation rate of the apparatus, whereas in the silicon halide system, hardly any generation of polysilane is remarked and this system is excellent from the viewpoint of maintenance.

Besides, the generated plasma need not to be spread to the whole vacuum vessel and a shape of confining the plasma between the substrate and the high frequency introducing electrode is allowable. When the plasma reaches the vacuum vessel wall, the outgassing due to heating of the wall of the vacuum vessel is inevitable, but the effect of suppressing the outgassing from the wall can be also expected by confining the plasma between the substrate and the high frequency introducing electrode.

In the case of forming a silicon thin film using the high frequency plasma CVD process, a high speed film formation is considered to be made possible by forming a silane-halide-based active species containing hydrogen such as $SiX_2H$ or $SiXH_2$ formed by adding hydrogen to silicon halides. In order to form silane-halide-based active species containing hydrogen such as the $SiX_2H$ or $SiXH_2$ mentioned above, an active reaction process of $SiX_4$ with activated hydrogen is necessary, but the forming method according to the present invention using relatively high pressure and plasma density is believed to be excellent also in consideration of this point. A large contribution of silane-halide-based active specifies containing hydrogen such as the above-mentioned $SiX_2H$ or $SiXH_2$ to the deposition is thought to enable the high speed film formation, but as other effects of hydrogen, there are included the improvement in crystallinity due to the activation of surface diffusion by hydrogen radicals, the effect of extracting F in or near the film surface, the inactivation of grain boundaries due to the passivation effect and the like, and the role of hydrogen in this reaction system seems to be great. Especially, as to relation between the flow rates of a silicon halide and hydrogen, it is preferable for great manifestation of the above effect that the flow rate of hydrogen is equal to or more than that of a silicon halide.

Next, structure components of the photovoltaic element according to the present invention will be described.

FIG. 1 is a schematic sectional view showing one example of the photoelectric element according to the present invention. In FIG. 1, reference numeral 101 denotes a substrate, reference numeral 102 a semiconductor layer, reference numeral 103 a second transparent conductive layer and reference numeral 104 a current collecting electrode. Besides, reference numeral 101-1 denotes a support, reference numeral 101-2 a metal layer and reference numeral 101-3 a first transparent conductive layer. These are structural members of the substrate 101.

Support

As the support 101-1, a plate-like member or sheet-like member, made of a metal, a resin, glass, ceramics, a semiconductor bulk or the like is appropriately used. On its surface, there may be a fine unevenness. A transparent support may be used to make such a construction as to allow light incidence through the support. Besides, by making the substrate into a long-scaled shape, continuous film formation using the roll-to-roll process can be carried out. Especially, a flexible material such as stainless steel or polyimide is appropriate as the material of the support 101-1.

Metal Layer

The metal layer 101-2 has a role serving as the electrode and a role serving as the reflective layer for reflecting the light reaching the support 101-1 and reutilizing it in the semiconductor layer 102. As its material, Al, Cu, Ag, Au, CuMg, AlSi or the like can be preferably used. As its forming process, a process such as evaporation, sputtering, electrodeposition or printing may suitably be used. The metal layer 101-2 preferably has an unevenness in its surface. Thereby, the optical path length of the reflected light in the semiconductor layer 102 can be increased to increase the short circuit current. If the support 101-1 or the first transparent conductive layer 101-3 has a high conductivity, provision of the metal layer 101-2 may be omitted. In case of the construction that light is incident through the support, it is preferable that the metal layer 101-2 is not provided.

First Transparent Conductive Layer

The first transparent conductive layer 101-3 has a role of increasing the irregular reflection of the incident light and the reflective light to increase the optical length in the semiconductor layer 102. Besides, it has a role of preventing the atoms of the metal layer 101-2 from causing diffusion or migration into the semiconductor layer 102 to effect shunt of the photovoltaic element. Furthermore, because of having a moderate resistivity, it has a role of preventing shorts due to defects such as pin-holes or the like of the semiconductor layer. If these roles are unnecessary, no first transparent conductive layer may be provided. As with the metal layer 101-2, it is preferable that the first transparent conductive layer 101-3 has an unevenness in its surface. It is also preferred that the first transparent conductive layer 101-3 is made of a conductive oxide such as ZnO, ITO, etc. and is formed using a process such as evaporation, sputtering, CVD, electrodeposition, etc. To these conductive oxides, a substance for changing the conductivity may be added.

Substrate

By the above processes, a metal layer 101-2 and a first transparent conductive layer 101-3 are stacked on the substrate 101-1 as needed to form a substrate 101. Besides, to facilitate the integration of the elements, an insulating layer may be provided as the intermediate layer in the substrate 101.

Semiconductor Layer

As the main material of the silicon-based semiconductor and the semiconductor layer 102 of the present invention, Si of the amorphous phase, the crystal phase or the multiphase thereof are used. In place of Si, an alloy of Si with C or Ge may also be used. In the semiconductor layer 102, hydrogen and/or halogen atoms are contained. Its preferred content ranges from 0.1 from 40 atomic %. Furthermore, the semiconductor layer 102 may further contain oxygen, nitrogen or the like.

To render the semiconductor layer into a p-type semiconductor layer, a Group III element of the periodic table is added, whereas a Group V element is added to render the semiconductor layer into an n-type semiconductor layer. As the electric characteristics of the p-type layer and the n-type layer, the activation energy is preferably 0.2 eV or less, more preferably 0.1 eV or less. Besides, the resistivity is preferably 100 $\Omega$cm or less and optimally 1 $\Omega$cm or less.

In the case of a stack cell (photovoltaic element with multiple pin junctions), it is preferable that the i-type semiconductor layer of a pin junction near the light incidence side has a wide band gap, and that the more distant from the light incidence side, the narrower band gap the i-type semiconductor layer of a pin junction has. Besides, it is preferred that inside the i-type layer, the minimum of band gap is present nearer to the p-type layer with regard to the center in the film thickness direction. As the doped layer (p-type layer or n-type layer) on the light incidence side, a crystalline semiconductor with less light absorption or a wide band gap semiconductor is suitable. As examples of stack cells with two pin junctions stacked, preferable combinations having i-type silicon-based semiconductor layers include a combination of an amorphous semiconductor layer and a semiconductor layer containing a crystal phase, and a combination of a semiconductor layer containing a crystal phase and a semiconductor layer containing a crystal phase, each arranged in the order as viewed from the light incidence side.

Besides, as examples of photovoltaic elements with three pin junctions stacked, preferred combinations having i-type silicon-based semiconductor layers include a combination of an amorphous semiconductor layer, an amorphous semiconductor layer and a semiconductor layer containing a crystal phase, a combination of an amorphous semiconductor layer, a semiconductor layer containing a crystal phase and a semiconductor layer containing a crystal phase, and a combination of a semiconductor layer containing a crystal phase, a semiconductor layer containing a crystal phase and a semiconductor layer containing a crystal phase, each arranged in the order as viewed from the light incidence side.

As the i-type semiconductor layer, it is preferred that the absorption coefficient ($\alpha$) of light (630 nm) is 5000 cm$^{-1}$ or more, the photoconductivity ($\sigma p$) under irradiation with artificial sunlight by a solar simulator (AM 1.5, 100 mW/cm$^2$) is 10×10$^{-5}$ S/cm or more, the dark conductivity ($\sigma d$) is 10×10$^{-6}$ or less, and the Urbach energy obtained by the Constant Photocurrent Method (CPM) is 55 meV or less. As the i-type semiconductor layer, even those slightly made the p-type or n-type can be used.

Figure 3:
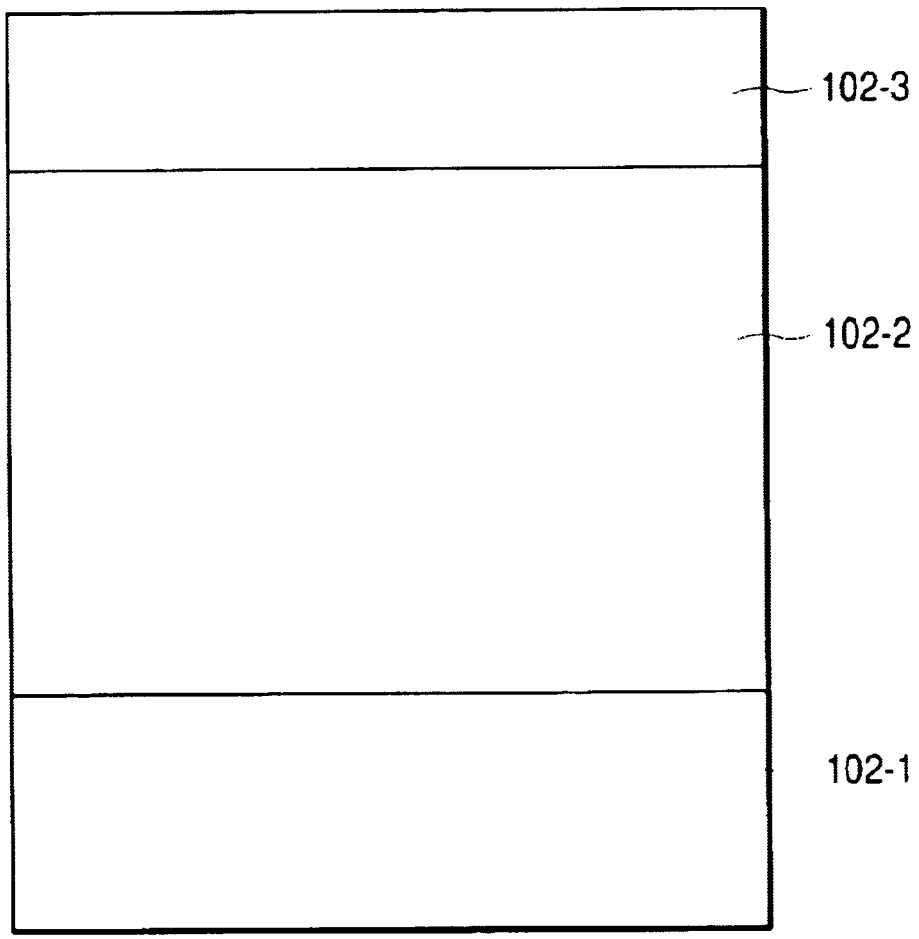
FIG. 3 is a schematic sectional view showing an example of the semiconductor layer according to the present invention.

A further description of the semiconductor layer 102 as the constitutional component of the present invention is made below. FIG. 3 is a schematic sectional view showing one example of the photovoltaic element according to the present invention having a semiconductor layer 102 with a single pin junction. In FIG. 3, reference numeral 102-1 denotes a semiconductor layer showing a first conductivity type and containing a crystal phase, and an i-type semiconductor layer 102-2 containing a crystal phase comprising a silicon-based thin film according to the present invention and a non-monocrystalline semiconductor layer 102-3 showing a second conductivity type are stacked thereon. In a semiconductor layer with a plurality of pin junctions, it is preferred that at least one of the junctions has the above constitution.

Method of Forming Semiconductor Layer

For formation of the silicon-based semiconductor according to the present invention and the above mentioned semiconductor layer 102, a high frequency plasma CVD process is preferably used. Hereinafter, an appropriate example of procedure for forming a semiconductor layer 102 by the high frequency plasma CVD process will be shown.

(1) The inner pressure of a pressure reducible semiconductor forming vacuum vessel is reduced to a given deposition pressure.

(2) Material gases such as a source gas, a dilution gas, etc. are introduced into a deposition chamber and the interior of the deposition chamber is set to a given deposition pressure while exhausting the interior of the deposition chamber by using a vacuum pump.

(3) The substrate 101 is set to a given temperature by using a heater.

(4) A high frequency oscillated by a high frequency power source is introduced into the above deposition chamber. The method of introduction into the above deposition chamber includes the steps of introducing a high frequency power by using a waveguide and introducing it into the deposition chamber through a dielectric window made of alumina ceramic or the like or the steps of introducing a high frequency power by using a coaxial cable and introducing it into the deposition chamber via a metal electrode.

(5) A plasma is generated in the deposition chamber to decompose the source gas and form a deposited film on the substrate 101 disposed in the deposition chamber. This procedure is repeated a plural number of times as needed to form the semiconductor layer 102.

When forming the semiconductor layer 102, a substrate temperature of 100 to 450° C., a pressure of 0.5 mTorr to 20 Torr and a high frequency power density of 0.001 to 1 W/cm$^3$ (input power/deposition chamber volume) are mentioned as preferred conditions in the deposition chamber.

As source gases suitable for the formation of the silicon-based semiconductor according to the present invention and the above semiconductor layer 102, there are included gasifiable compounds containing silicon atoms such as $SiH_4$, $Si_2H_6$, etc. and silicon halides such as $SiF_4$, $Si_2F_6$, $SiH_2F_2$, $SiH_2Cl_2$, $SiCl_4$ and $Si_2Cl_6$, etc. At least a part of the i-type semiconductor layer is formed using a silicon halide. In this case, it is particularly preferable to use $SiF_4$. Of the above mentioned materials, those gasified at ordinary temperature are used by means of a gas cylinder and those liquified are used with bubbling by an inert gas. In case of making alloy system ones, it is desirable to further add gasifiable compounds containing Ge or C such as $GeH_4$ or $CH_4$ to a source gas.

It is preferred that the source gas is introduced into the deposition chamber while being diluted with a dilution gas. As the dilution gas, $H_2$, He or the like are included. Furthermore, a gasifiable compound containing nitrogen, oxygen or the like may be added as the source gas or the dilution gas.

As the dopant gas for rendering the semiconductor layer a p-type layer, $B_2H_6$, $BF_3$ or the like is used. Besides, as the dopant gas for rendering the semiconductor layer an n-type layer, $PH_3$, $PF_3$ or the like is used. In case of depositing a thin film of a crystal phase or a layer with a less light absorption or wide band gap such as SiC, it is preferable to increase the ratio of the dilution gas to the source gas and to introduce a high frequency with a relatively high power density.

Second Transparent Conductive Layer

The second transparent conductive layer 103 serves as an electrode on the light incidence side and can also play a role of an antireflection film by setting its film thickness properly. It is required for the second transparent conductive layer 103 to have a high transmittance in the region of the absorbable wavelength of the semiconductor layer 102 and a low resistivity. The transmittance at 550 nm is preferably 80% or more and more preferably 85% or more.

The resistivity is preferably 5×10$^{-3}$ $\Omega$cm or less and well preferably 1×10$^{-3}$ $\Omega$cm or less.

As the material of the second transparent conductive layer 103, ITO, ZnO, $In_2O_3$ or the like can be used preferably. As its forming method, a process such as evaporation, CVD, spraying, spinning on or dipping is preferably used. To these materials, a substance changing the conductivity may be added.

Current Collecting Electrode

The current collecting electrode 104 is provided on the transparent electrode 103 in order to improve the current collection efficiency. As its forming method, the methods of forming an electrode pattern metal by the sputtering using a mask, printing a conductive paste or soldering paste, fixing a metal wire with a conductive paste or the like are preferably used.

Incidentally, protective layers may be formed on the both surfaces of the photovoltaic element as the occasion may demand. In addition, a reinforcing material such as copper plate or the like may be further provided on the surfaces (at the light incidence and reflection sides) of the photovoltaic element.

In the following examples, the present invention will be described in detail by taking a solar cell as one example of the photoelectric element, but the examples do not limit the present invention at all.

EXAMPLE 1

Figure 2:
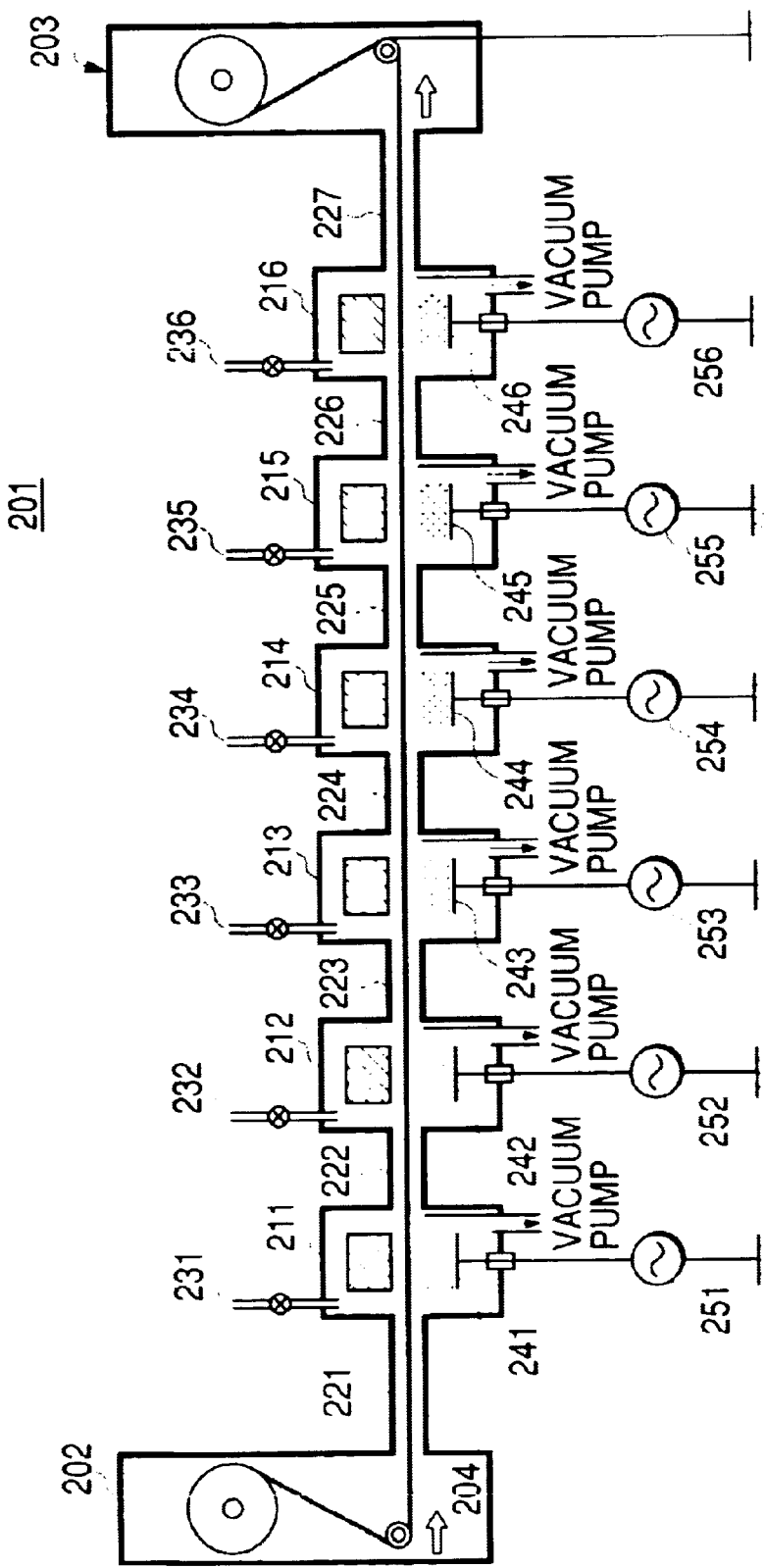
FIG. 2 is a schematic sectional view showing an example of a deposited film forming apparatus for producing the silicon-based thin film and photovoltaic element according to the present invention.

Using the deposited film forming apparatus 201 shown in FIG. 2, silicon-based thin films were formed in accordance with the following procedure.

FIG. 2 is a schematic sectional view showing one example of a deposited film forming apparatus for manufacturing the silicon-based thin film and the photovoltaic element according to the present invention. The deposited film forming apparatus 201 shown in FIG. 2 comprises a combination of a substrate supply vessel 202, semiconductor forming vacuum vessels 211 to 216 and a substrate winding vessel 203 via gas gates 221 to 227. In the deposited film forming apparatus 201, a belt-like conductive substrate 204 is set through the respective vessels and gas gates. The belt-like conductive substrate 204 is wound off from a bobbin installed in the substrate supply vessel 202 and wound up on another bobbin in the substrate winding vessel 203.

The semiconductor forming vacuum vessels 211 to 216 each have a deposition chamber and a glow discharge is induced by applying a high frequency power from the high frequency power sources 251 to 256 to the high frequency introducing electrodes 241 to 246 in the chambers, thereby decomposing a source gas to deposit a semiconductor layer on the conductive substrate 204. Besides, to the individual semiconductor forming vacuum vessels 211 to 216 are connected gas introducing pipes 231 to 236 for introducing a source gases or dilution gas.

The deposited film forming apparatus 201 shown in FIG. 2 is equipped with 6 semiconductor forming vacuum vessels, but in the following examples, it is not necessarily required to generate glow discharge in all of the semiconductor forming vacuum vessels and the presence or absence of glow discharge in the individual vessels can be separately selected in conformity with the layer structure of a photovoltaic element to be manufactured. Besides, in each semiconductor forming vacuum vessel, an unillustrated film-forming-region-adjusting plate is provided to adjust the contact area of the conductive substrate 204 with the discharge space, so that by adjusting this plate, the film thickness of the respective semiconductor layer formed in each vessel can be adjusted. Besides, the high frequency introducing electrode in each semiconductor forming vacuum vessel is so arranged as to change the distance d between the high frequency introducing electrode and the substrate by using an unillustrated movable mechanism.

First of all, a belt-like substrate (40 cm in width, 200 m in length and 0.125 mm in thickness) made of stainless steel (SUS 430BA) was fully degreased, cleaned and mounted on an unillustrated continuous sputtering apparatus and a 100 nm thick Ag thin film was vaporized by sputtering with an Ag electrode employed as the target. Furthermore, by using a ZnO target, a 1.2 $\mu$m thick ZnO thin film was vaporized by sputtering on the Ag thin film to form a belt-like conductive substrate 204.

Next, in the substrate supply vessel 202, a bobbin with the conductive substrate 204 wound thereon was mounted, the conductive substrate 204 was penetrated up to the substrate winding vessel 203 via the gas gate at the carry-in side, the semiconductor forming vacuum vessels 211, 212, 213, 214, 215 and 216 and the gas gate at the carry-out side and tension adjustment was performed so as not to slacken the belt-like conductive substrate 204. Then, the substrate supply vessel 202, the semiconductor forming vacuum vessels 211, 212, 213, 214, 215 and 216 and the substrate winding vessel 203 were fully evacuated to $5\times10^{-6}$ Torr or less by using an unillustrated evacuation system having a vacuum pump.

Then, while operating the evacuation system, a source gas and a dilution gas were supplied to the semiconductor forming vacuum vessel 212 through the gas introducing pipe 232.

Besides, to the semiconductor forming vacuum vessels other than the semiconductor forming vacuum vessel 212, $H_2$ gas was supplied at 200 sccm through each gas introducing pipe and at the same time through each of unillustrated individual gate gas supply pipes, $H_2$ gas as the gate gas was supplied at 500 sccm to individual gas gates. In this state, the exhaust capacity of the evacuation system was regulated to adjust the pressure inside the semiconductor forming vacuum vessel 212 to a desired pressure. The forming conditions are as shown in Table 1.

TABLE 1

| Forming conditions of 212 | Source gases | $SiF_4$: 50 sccm $H_2$: 300 sccm |
|---|---|---|
| | Substrate temperature | 400° C. |
| | Pressure | 100 mTorr |

After the pressure inside the semiconductor forming vacuum vessel 212 was stabilized, the movement of the conductive substrate 204 was started in the direction from the substrate supply vessel 202 to the substrate winding vessel 203.

Next, a high frequency was introduced into the high frequency introducing electrode 242 in the semiconductor forming vacuum vessel 212 from the high frequency power source 252, a glow discharge was generated in the deposition chamber within the semiconductor forming vacuum vessel 212 and an i-type semiconductor layer containing a crystal phase was formed on the conductive substrate 204 in a fixed time to form a silicon-based thin film. In the above process, into the semiconductor forming vacuum vessel 212, a high frequency, 2.45 GHz in frequency and 300 W in power, was introduced from the high frequency introducing electrode 242, 100 cm$^2$ in surface area S. Besides, the formation of the silicon thin film was carried out while setting the distance d between the high frequency introducing electrode and the substrate at 3 cm and at 6 cm by using a movable mechanism (Examples 1-1A and 1-2A, respectively). At this time, the values of Q obtained by the equation $Q=P_o\times P_R/S/d$ were 100 and 50, respectively.

Then, by following the procedure of Example 1-1A with the exception that the distance between the high frequency introducing electrode and the substrate was set to 9 cm, a silicon-based thin film was formed (Comparative Example 1A). At this time, the value of Q was 33.3.

The silicon-based thin films formed in Examples 1-1A and 1-2A and Comparative Example 1 were cut, SEM observation of the sections was performed, and the film thicknesses were measured and the film forming rates were determined. The results are shown in Table 2.

Then, with the respective distances d between the high frequency introducing electrode and the substrate of the examples, silicon-based thin films were formed with the film thickness unified to 1 $\mu$m (Examples 1-1B and 1-2B and Comparative Example 1B).

For the silicon-based thin films prepared in Examples 1-1B and 1-2B and Comparative Example 1B, diffraction peaks were measured using an X-ray diffraction apparatus, the ratio of the diffraction intensity of (220) to the total diffraction intensity was examined and further the Scherrer radius was determined from the half-width of the diffraction peak of the (220) reflection. Besides, the Urbach energy was measured by the Constant Photocurrent Method (CPM). These results are shown in Table 2.

TABLE 2

|  | Example 1-1 | Example 1-2 | Comparative Example 1 |
|---|---|---|---|
| d | 3 cm | 6 cm | 9 cm |
| Q | 100 | 50 | 33.3 |
| Film forming rate | 1 | 0.95 | 0.4 |
| Ratio of (220) diffraction intensity to total diffraction intensity | 1 | 0.98 | 0.8 |
| (220) Scherrer radius | 1 | 1.02 | 0.75 |
| Urbach energy | 30 meV | 31 meV | 60 meV |

Note:
In Table 2, the film forming rate, the ratio of the (220) diffraction intensity to the total diffraction intensity and the (220) Scherrer Radius are represented in terms of relative values as normalized with the values of Example 1-1 each taken as 1.

As shown in Table 2, the silicon-based thin films of Examples 1-1 and 1-2 are greater in film forming rate, stronger in (220) orientatability, greater in crystal grain size and better in film quality than that of Comparative Example 1. It is seen from the above results that the silicon-based thin films according to the present invention have excellent advantages.

EXAMPLE 2

Using the deposited film forming apparatus 201 shown in FIG. 2, silicon-based thin films were formed in accordance with the following procedure.

As with Example 1, a belt-like conductive substrate 204 was prepared and mounted on the deposited film forming apparatus 201, then the substrate supply vessel 202, the semiconductor forming vacuum vessels 211, 212, 213, 214, 215 and 216 and the substrate winding vessel 203 were fully evacuated to $5 \times 10^{-6}$ Torr or less by using an unillustrated evacuation system comprising a vacuum pump.

Then, while operating the evacuation system, a source gas and a dilution gas were supplied to the semiconductor forming vacuum vessel 212 from the gas introducing pipe 232.

Besides, to the semiconductor forming vacuum vessels other than the semiconductor forming vacuum vessel 212, 200 sccm $H_2$ gas was supplied from the gas introducing pipes and at the same time from unillustrated individual gate gas supply pipes, 500 sccm $H_2$ gas was supplied as the gate gas to the individual gas gates. In this state, the exhaust capacity of the evacuation system was regulated to adjust the pressure inside the semiconductor forming vacuum vessel 212 to a desired pressure.

Next, a high frequency was introduced into the high frequency introducing electrode 242 in the semiconductor forming vacuum vessel 212 from the high frequency power source 252, a glow discharge was generated in the deposition chamber within the semiconductor forming vacuum vessel 212 and an i-type semiconductor layer (1 μm in film thickness) containing a crystal phase was formed on the conductive substrate 204 to form a silicon-based thin film. In the above process, into the semiconductor forming vacuum vessel 212, a high frequency, 2.45 GHz in frequency and 300 W in power, was introduced from the high frequency introducing electrode 242, 100 cm$^2$ in surface area S. The formation of silicon thin films were carried out with the $H_2$ flow rates varied as shown in Table 3. The distance d between the high frequency introducing electrode and the substrate was fixed at 3 cm (Examples 2-1, 2-2 and 2-3).

TABLE 3

| Forming conditions of 212 | Source gases | SiF$_4$: 50 sccm<br>H$_2$: 25 sccm (Example 2-1)<br>H$_2$: 50 sccm (Example 2-2)<br>H$_2$: 75 sccm (Example 2-3) |
|---|---|---|
|  | Substrate temperature | 400° C. |
|  | Pressure | 100 mTorr |

Raman scattering spectra of the silicon-based thin films formed in Examples 2-1 and 2-2 and 2-3 were measured and the Raman intensity ratio between that obtained in the vicinity of 520 cm$^{-1}$ (originating in the crystal component) and that in the vicinity of 480 cm$^{-1}$ (originating in the amorphous component) was examined. Beside, the Urbach energy was measured by the Constant Photocurrent Method (CPM). These results are shown in Table 4.

TABLE 4

|  | Example 2-1 | Example 2-2 | Example 2-3 |
|---|---|---|---|
| SiF$_4$/H$_2$ | 50/25 | 50/50 | 50/75 |
| Raman intensity ratio (520 cm$^{-1}$/480 cm$^{-1}$) | 5.0 | 7.5 | 7.8 |
| Urbach energy | 35 meV | 32 meV | 31 meV |

It is seen from the results that the silicon-based thin films of Examples 2-1, 2-2 and 2-3 showed excellent crystallinity and were excellent in film quality, and setting the flow rates so as to be SiF$_4$ <H$_2$ exhibited more excellent advantages.

EXAMPLE 3

Using the deposited film forming apparatus 201 shown in FIG. 2, silicon-based thin films were formed in accordance with the following procedure.

As with Example 1, a belt-like conductive substrate 204 was prepared and mounted on the deposited film forming apparatus 201, then the substrate supply vessel 202, semiconductor forming vacuum vessels 211, 212, 213, 214, 215 and 216 and the substrate winding vessel 203 were fully evacuated to $5 \times 10^{-6}$ Torr or less by using an unillustrated evacuation system comprising a vacuum pump.

Then, while operating the evacuation system, the source gas and dilution gas shown in Table 5 were supplied to the semiconductor forming vacuum vessel 212 from the gas introducing pipe 232.

TABLE 5

| Forming conditions of 212 | Source gases | SiF$_4$: 50 sccm<br>H$_2$: 300 sccm |
|---|---|---|
|  | Substrate temperature | 400° C. |
|  | Pressure | 50 mTorr (Example 3-1)<br>100 mTorr (Example 3-2)<br>500 mTorr (Example 3-3)<br>10 mTorr (Comparative Example 3) |

Besides, to the semiconductor forming vacuum vessels other than the semiconductor forming vacuum vessel 212, 200 sccm $H_2$ gas was supplied from the gas introducing pipes and at the same time from unillustrated individual gate gas supply pipes, 500 sccm $H_2$ gas was supplied as the gate gas to the individual gas gates.

Next, a high frequency was introduced into the high frequency introducing electrode 242 in the semiconductor forming vacuum vessel 212 from the high frequency power source 252, a glow discharge was generated in the deposition chamber within the semiconductor forming vacuum vessel 212 and an i-type semiconductor layer (1 μm in film thickness) containing a crystal phase was formed on the conductive substrate 204 to form a silicon-based thin film. In the above process, into the semiconductor forming vacuum vessel 212, a high frequency, 2.45 GHz in frequency and 800 W in power, was introduced from the high frequency introducing electrode 242, 100 cm² in surface area S. The formation of silicon thin films was carried out with the four kinds of different pressures inside the semiconductor forming vacuum vessel 212 as shown in Table 5. The distance d between the high frequency introducing electrode and the substrate was fixed at 3 cm (Examples 3-1, 3-2 and 3-3 and Comparative Example 3).

For the silicon-based thin films prepared in Examples 3-1, 3-2 and 3-3 and Comparative Example 3, diffraction peaks were measured using an X-ray diffraction apparatus, the ratio of the diffraction intensity of (220) to the total diffraction intensity was examined and further the Scherrer radius was determined from the half-width of the diffraction peak in the (220) reflection. Besides, the Urbach energy was measured by the Constant Photocurrent Method (CPM). The results are shown in Table 6.

TABLE 6

| | Example 3-1 | Example 3-2 | Example 3-3 | Comparative Example 3 |
|---|---|---|---|---|
| $P_R$ | 50 mTorr | 100 mTorr | 500 mTorr | 10 mTorr |
| Q | 50 | 100 | 500 | 10 |
| Ratio of (220) diffraction intensity to total diffraction intensity | 1 | 1.05 | 1.10 | 0.75 |
| (220) Scherrer radius | 1 | 1.07 | 1.12 | 0.75 |
| Urbach energy | 36 meV | 31 mev | 31 meV | 60 meV |

Note:
In Table 6, the film forming rate, the ratio of the (220) diffraction intensity to the total diffraction intensity and the (220) Scherrer Radius are represented in terms of relative values as normalized with the values of Example 3-1 each taken as 1.

As shown in Table 6, the silicon-based thin films of Examples 3-1, 3-2 and 3-3 are stronger in (220) orientatability, greater in crystal grain size and better in film quality than the silicon-based thin film of Comparative Example 3. It is seen from the results that the silicon-based thin films according to the present invention have excellent advantages. Especially, when the pressure $P_R$ inside the semiconductor forming vacuum vessel 212 is 50 mTorr or more, they are found to have more excellent advantages.

EXAMPLE 4

Figure 4:
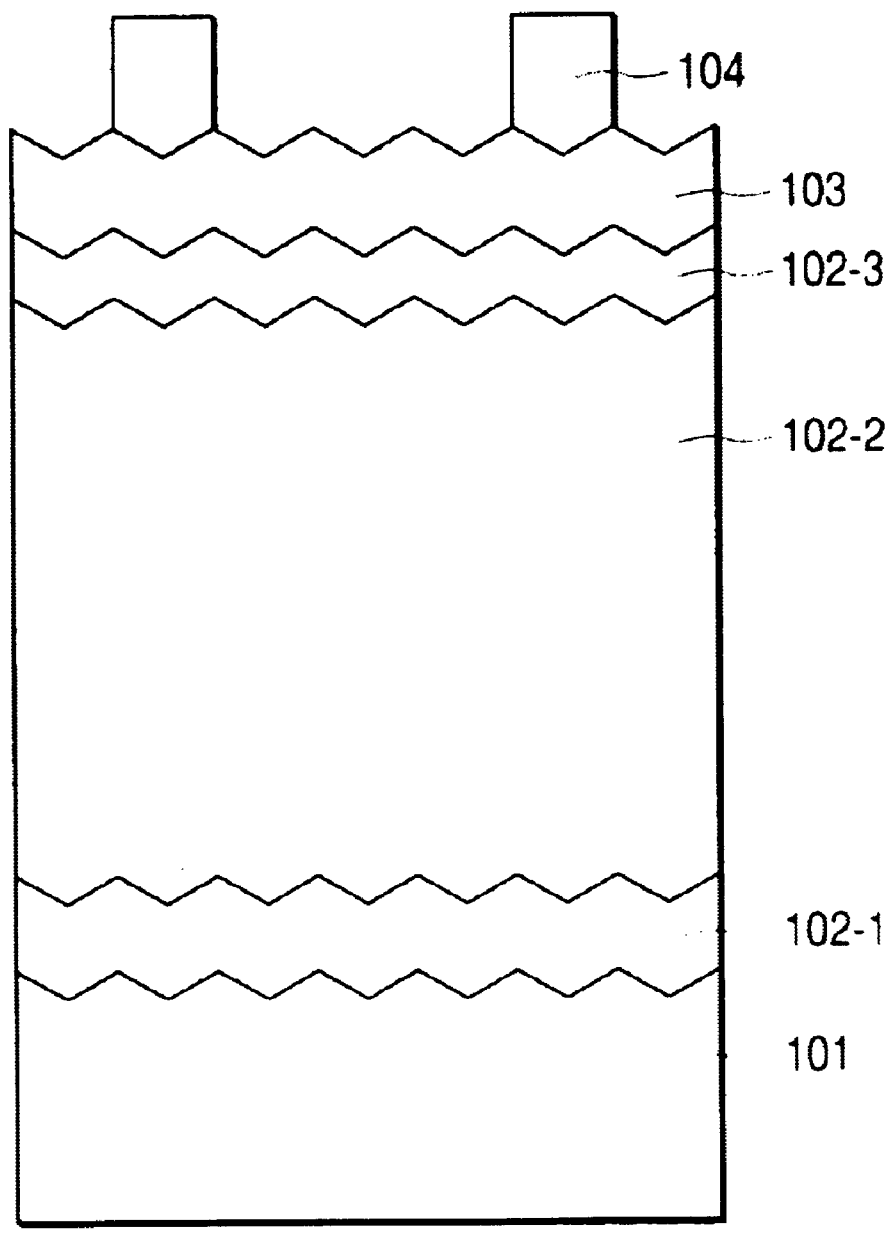
FIG. 4 is a schematic sectional view showing an example of the photovoltaic element containing a silicon-based thin film according to the present invention.

Using the deposited film forming apparatus 201 shown in FIG. 2, pin-type photovoltaic elements shown in FIG. 4 were formed in accordance with the following procedure. FIG. 4 is a schematic sectional view showing one example of the photovoltaic element having the silicon-based thin film according to the present invention. In FIG. 4, the same numerals are employed as are employed in FIG. 1 and the description thereof is omitted. The semiconductor layer of this photovoltaic element consists of an amorphous n-type semiconductor layer 102-1, an i-type semiconductor layer 102-2 containing a crystal phase and a microcrystalline p-type semiconductor layer 102-3. Namely, this photovoltaic element is the so-called pin-type single cell photovoltaic element.

As with Example 1, a belt-like conductive substrate 204 is prepared and is mounted on the deposited film forming apparatus 201, then the substrate supply vessel 202, the semiconductor forming vacuum vessels 211, 212, 213, 214, 215 and 216 and the substrate winding vessel 203 were fully evacuated to 5×10⁻⁶ Torr or less by using an unillustrated evacuation system comprising a vacuum pump.

Then, while operating the evacuation system, the source gas and dilution gas were supplied to the semiconductor forming vacuum vessels 211 to 213 from the gas introducing pipes 231 to 233.

Besides, to the semiconductor forming vacuum vessels other than the semiconductor forming vacuum vessels 211 to 213, 200 sccm $H_2$ gas was supplied from gas introducing pipes and at the same time from unillustrated individual gate gas supply pipes, 500 sccm $H_2$ gas was supplied as the gate gas to the individual gas gates. In this state, the exhaust capacity of the evacuation system was regulated to adjust the pressure inside the semiconductor forming vacuum vessels 211 to 213 to desired pressures.

TABLE 7

| Forming conditions of 211 | Source gases | $SiH_4$: 20 sccm<br>$H_2$: 100 sccm<br>$PH_3$ (diluted to 2% with $H_2$): 30 sccm |
|---|---|---|
| | Substrate temperature | 300° C. |
| | Pressure | 1.0 Torr |
| Forming conditions of 212 | Source gases | $SiH_4$: 50 sccm<br>$H_2$: 300 sccm |
| | Substrate temperature | 400° C. |
| | Pressure | 100 mTorr |
| Forming conditions of 213 | Source gases | $SiH_4$: 10 sccm<br>$H_2$: 800 sccm<br>$BF_3$ (diluted to 2% with $H_2$): 100 sccm |
| | Substrate temperature | 200° C. |
| | Pressure | 1.2 Torr |

After the pressures inside the semiconductor forming vacuum vessels 211 to 213 were stabilized, the movement of the conductive substrate 204 was started in the direction from the substrate supply vessel 202 to the substrate winding vessel 203.

Next, a high frequency was introduced into the high frequency introducing electrodes 241 to 243 in the semiconductor forming vacuum vessels 211 to 213 from the high frequency power sources 251 to 253, a glow discharge was generated in each of the deposition chambers within the semiconductor forming vacuum vessels 211 to 213, then an amorphous n-type semiconductor layer (30 nm in film thickness), an i-type semiconductor layer (1.5 μm in film thickness) containing a crystal phase and a microcrystalline p-type semiconductor layer (10 nm in film thickness) were formed on the conductive substrate 204 to form a silicon-based thin film.

In the above process, into the semiconductor forming vacuum vessel 211, a high frequency, 13.56 MHz in frequency and 5 mW/cm³ in power density, was introduced, whereas a high frequency, 13.56 MHz in frequency and 30 mW/cm³ in power density, was introduced into the semiconductor forming vacuum vessel 213. Further, into the semiconductor forming vacuum vessel 212, a high frequency, 2.45 GHz in frequency and 300 mW/cm$^3$ in power density, was introduced from the high frequency introducing electrode 242, 100 cm$^2$ in surface area S. Besides, the distance d between the high frequency introducing electrode and the substrate was set to 3 cm. At this time, the value of Q defined by Q=$P_o \times P_R$/S/d is 100. Then, the thus formed belt-like photovoltaic element was processed into a 36 cm×22 cm solar cell module (Example 4) using an unillustrated continuous module formation apparatus.

Next, by following the same procedure as Example 4 with the exception that the distance d between the high frequency introducing electrode and the substrate was set to 9 cm, a solar cell module was formed (Comparative Example 4). At this time, the value of Q is 33.3.

The photoelectric conversion efficiencies of the solar cell modules produced as Example 4 and Comparative Example 4 was measured using a solar simulator (AM 1.5, 100 mW/cm$^2$). When the photoelectric conversion efficiency of the solar cell module of Example 4 was normalized to 1, the value of the photoelectric conversion efficiency of the solar cell module produced in Comparative Example 4 was 0.85.

Besides, using the cross cut tape test (gap distance between cuts: 1 mm; number of checkers (or squares): 100), the adhesion between the conductive substrate and the semiconductor layer was examined. Then, the solar cell modules whose initial photoelectric conversion efficiency had been measured in advance were placed in a dark place of temperature 85° C. and humidity 85%, held for 30 min and thereafter lowered in temperature to −20° C. in 70 min and held for 30 min. Again, the environment was restored to temperature 85° C. and humidity 85% in 70 min. After repeating this cycle 100 times, the photoelectric conversion efficiencies were measured again to examine variations in photoelectric conversion efficiency due to the temperature and relative humidity test. Furthermore, the solar cell modules whose initial photoelectric conversion efficiency had been measured in advance were kept at 50° C. and irradiated for 500 hours with an artificial sunlight of AM 1.5 and 100 mW/cm$^2$, and then measured for the photoelectric conversion efficiency to examine the variations in the photoelectric conversion efficiency due to the photodegradation test. The results are shown in Table 8.

TABLE 8

|  | Example 4 | Comparative Example 4 |
|---|---|---|
| Initial photoelectric conversion efficiency | 1 | 0.85 |
| Number of existing checkers by cross cut tape test | 1 | 0.85 |
| Variation in photoelectric conversion efficiency due to temperature and relative humidity test (Efficiency after test/Initial efficiency) | 1.0 | 0.90 |
| Variation in photoelectric conversion efficiency due to photodegradation test | 1.0 | 0.90 |

The initial photoelectric conversion efficiency and the number of existing checkers according to the cross cut tape test are represented in terms of relative values as normalized with the values of Example 4 each taken as 1.

It is seen from the results that the solar cell module with the photovoltaic element according to the present invention has excellent advantages.

EXAMPLE 5

Figure 5:
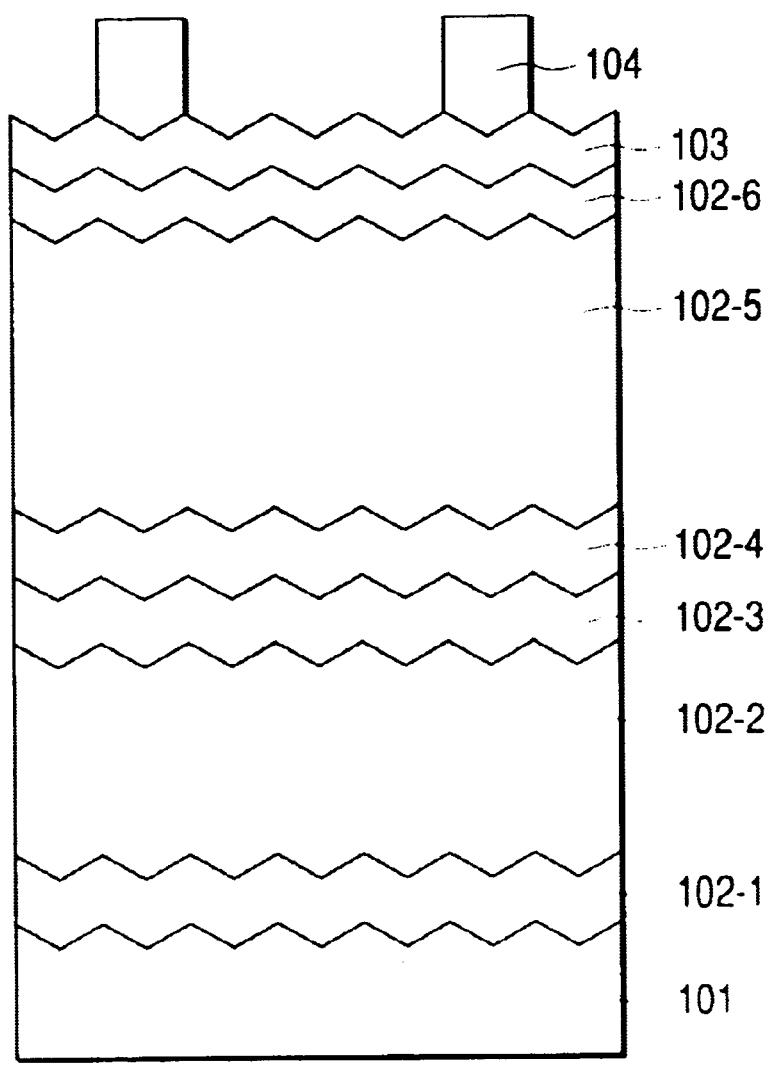
FIG. 5 is a schematic sectional view showing another example of the photovoltaic element including a silicon-based thin film according to the present invention.

Using the deposited film forming apparatus 201 shown in FIG. 2, the photovoltaic element shown in FIG. 5 was formed in accordance with the following procedure. FIG. 5 is a schematic sectional view showing one example of the photovoltaic element having the silicon-based thin film according to the present invention. In FIG. 5, the same numerals are employed as are employed in FIG. 1 and the description thereof is omitted. The semiconductor layer of this photovoltaic element comprises an amorphous n-type semiconductor layer 102-1, an i-type semiconductor layer 102-2 containing a crystal phase, a microcrystalline p-type semiconductor layer 102-3, an amorphous n-type semiconductor layer 102-4, an i-type semiconductor layer 102-5 containing a crystal phase and a microcrystalline p-type semiconductor layer 102-6. Namely, this photovoltaic element is the so-called pin-pin-type double cell photovoltaic element.

As with Example 1, a belt-like conductive substrate 204 is prepared and mounted on the deposited film forming apparatus 201, then the substrate supply vessel 202, the semiconductor forming vacuum vessels 211, 212, 213, 214, 215 and 216 and the substrate winding vessel 203 were fully evacuated to 5×10$^{-6}$ Torr or less by using an unillustrated evacuation system comprising a vacuum pump.

Then, while operating the evacuation system, the source gas and dilution gas were supplied to the semiconductor forming vacuum vessels 211 to 216 from the gas introducing pipes 231 to 236.

Besides, from unillustrated individual gate gas supply pipes, 500 sccm H$_2$ gas was supplied as the gate gas to the respective gas gates. In this state, the exhaust capacity of the evacuation system was regulated to adjust the pressures inside the semiconductor forming vacuum vessels 211 to 216 to desired pressures. The forming conditions employed for both the bottom cell and the top cell were as shown in Table 7.

After the pressures inside the semiconductor forming vacuum vessels 211 to 216 were stabilized, the movement of the conductive substrate 204 was started in the direction from the substrate supply vessel 202 to the substrate winding vessel 203.

Next, a high frequency was introduced into the high frequency introducing electrodes 241 to 246 in the semiconductor forming vacuum vessels 211 to 216 from the high frequency power sources 251 to 256, a glow discharge was generated in each of the deposition chambers within the semiconductor forming vacuum vessels 211 to 216, then an amorphous n-type semiconductor layer (30 nm in film thickness), an i-type semiconductor layer (2.0 μm in film thickness) containing a crystal phase and a microcrystalline p-type semiconductor layer (10 nm in film thickness) were formed on the conductive substrate 204 to form the bottom cell, and then an amorphous n-type semiconductor layer (30 nm in film thickness), an i-type semiconductor layer (1.2 μm in film thickness) containing a crystal phase and a microcrystalline p-type semiconductor layer (10 nm in film thickness) were further formed on the conductive substrate 204 to form the top cell, thus forming the double cell photovoltaic element.

In the above process, into the semiconductor forming vacuum vessels 211 and 214, a high frequency, 13.56 MHz in frequency and 5 mW/cm$^3$ in power density, was introduced, whereas a high frequency, 13.56 MHz in frequency and 30 mW/cm$^3$ in power density, was introduced into the semiconductor forming vacuum vessels 213 and 216. Further, into the semiconductor forming vacuum vessels 212 and 215, a high frequency, 2.45 GHz in frequency and 300 mW/cm$^3$ in power density, was introduced from the high frequency introducing electrodes 242, 245, each 100 cm² in surface area S. Besides, the distance d between the high frequency introducing electrode and the substrate was set to 3 cm. At this time, the value of Q defined by $Q=P_O \times P_R/S/d$ is 100. Then, the thus formed belt-like photovoltaic element was processed into a 36 cm×22 cm solar cell module (Example 5) using an unillustrated continuous module formation apparatus.

The solar cell module of Example 5 showed a photoelectric conversion efficiency which was 1.2 times the photoelectric conversion efficiency of Example 4 and was excellent in adhesion and durability to the temperature and relative humidity test and the photodegradation test. It is seen from the above that the solar cell module with the photovoltaic element according to the present invention have excellent advantages.

As described above, according to the present invention, in the high frequency plasma CVD using a source gas containing a silicon halide and hydrogen, by controlling the supplied power $P_o$ (W), the high frequency introducing electrode area S (cm²), the distance d (cm) between the high frequency introducing electrode and the substrate, and the pressure $P_R$ (mTorr) such that the value of Q defined by $Q=P_o \times P_R/S/d$ is 50 or more, it is possible to deposit a silicon-based thin film high in crystallizing ratio and good in crystallinity at a high speed, and by using the silicon-based thin film as at least a part of at least one i-type semiconductor layer of a photovoltaic element comprising at least one pin junction on a substrate, it becomes possible to form photovoltaic elements with good photoelectric conversion efficiency and excellent adhesion and environmental resistivity at a far lower production cost than before.

What is claimed is:

1. A method of forming a silicon-based thin film comprising effecting high frequency plasma CVD using a source gas comprising a silicon halide and hydrogen, wherein the value of Q defined by $Q=P_O \times P_R/S/d$ is 50 or more, wherein $P_O$(W) is a supplied power, S (cm²) is an area of a high frequency introducing electrode, d (cm) is a distance between the high frequency introducing electrode and a substrate, and $P_R$ (mTorr) is a pressure.

2. The method according to claim 1, wherein the silicon halide contains at least one of fluorine or chlorine.

3. The method according to claim 1, wherein a flow rate of the hydrogen of the source gas is not less than the flow rate of the silicon halide.

4. The method according to claim 1, wherein the pressure $P_R$ is 50 mTorr or more.

* * * * *